United States Patent
Buhagiar

(10) Patent No.: US 10,935,580 B2
(45) Date of Patent: Mar. 2, 2021

(54) SYSTEM AND METHOD FOR DYNAMICALLY DETERMINING MAXIMUM ELECTRIC CURRENT CARRYING CAPACITIES

(71) Applicant: RTE Reseau de transport d'electricite, Paris la Defense (FR)

(72) Inventor: Thierry Buhagiar, Marseilles (FR)

(73) Assignee: RTE Reseau de transport d'electricite, Paris la Defense (FR)

( * ) Notice: Subject to any disclaimer, the term of this patent is extended or adjusted under 35 U.S.C. 154(b) by 333 days.

(21) Appl. No.: 16/069,936

(22) PCT Filed: Jan. 19, 2017

(86) PCT No.: PCT/FR2017/050109
§ 371 (c)(1),
(2) Date: Jul. 13, 2018

(87) PCT Pub. No.: WO2017/125683
PCT Pub. Date: Jul. 27, 2017

(65) Prior Publication Data
US 2019/0033350 A1    Jan. 31, 2019

(30) Foreign Application Priority Data

Jan. 21, 2016 (FR) ..................... 16 50466

(51) Int. Cl.
*G01R 19/25* (2006.01)
*G01R 19/30* (2006.01)
(Continued)

(52) U.S. Cl.
CPC ............ *G01R 19/2506* (2013.01); *G01P 5/10* (2013.01); *G01R 19/30* (2013.01); *G01R 31/58* (2020.01);
(Continued)

(58) Field of Classification Search
CPC .... G01R 19/2506; G01R 19/30; G01R 31/58; H02J 13/00007; H02J 13/00;
(Continued)

(56) References Cited

U.S. PATENT DOCUMENTS

| 5,559,430 A | 9/1996 | Seppa |
| 5,918,288 A | 6/1999 | Seppa |

(Continued)

FOREIGN PATENT DOCUMENTS

| WO | WO 2007/031435 A1 | 3/2007 |
| WO | WO 2012/015507 A1 | 2/2012 |

(Continued)

OTHER PUBLICATIONS

International Search Report dated Jun. 14, 2017, in PCT/FR2017/050109 filed Jan. 19, 2017.
(Continued)

*Primary Examiner* — Manuel L Barbee
(74) *Attorney, Agent, or Firm* — Oblon, McClelland, Maier & Neustadt, L.L.P.

(57) ABSTRACT

This system (40) for dynamically determining maximum electric current carrying capacities comprises: means (44) for storing a model (54) of a network portion (10), a thermal equilibrium relationship (56), operating limit temperatures and conduction parameters; and a receiver (46) for wind speed values measured by wind measurement stations (24, 26, 28, 30).

It further comprises a computer (48) programmed (62, 64, 66, 68) to: apply a model (60) of wind propagation from at least one selected station towards singular points of the model (54) of the network portion, in order to estimate a wind speed value at each singular point; and calculate at least one maximum capacity value at each singular point on the basis of the thermal equilibrium relationship (56), of (Continued)

each operating limit temperature, of each conduction parameter and of weather parameters (58), taking into account said wind speed value estimated at each singular point in the thermal equilibrium relationship (56).

10 Claims, 2 Drawing Sheets

(51) Int. Cl.
*G01P 5/10* (2006.01)
*G01R 31/58* (2020.01)
*H02J 13/00* (2006.01)
*H02J 3/00* (2006.01)

(52) U.S. Cl.
CPC ............... *H02J 3/00* (2013.01); *H02J 13/00* (2013.01); *H02J 13/00007* (2020.01); *H02J 2203/20* (2020.01); *Y02E 60/00* (2013.01); *Y04S 10/30* (2013.01); *Y04S 40/20* (2013.01)

(58) Field of Classification Search
CPC .. H02J 13/00034; H02J 13/00002; H02J 3/00; G01P 5/10; Y04S 40/20; Y04S 10/30
See application file for complete search history.

(56) References Cited

U.S. PATENT DOCUMENTS

| | | |
|---|---|---|
| 2012/0029720 A1 | 2/2012 | Cherian et al. |
| 2013/0054162 A1 | 2/2013 | Smith et al. |
| 2013/0054183 A1 | 2/2013 | Afzal et al. |
| 2013/0205900 A1 | 8/2013 | Nulty |
| 2014/0163884 A1 | 6/2014 | Lilien et al. |
| 2014/0180616 A1 | 6/2014 | Aaserude et al. |
| 2015/0268379 A1 | 9/2015 | Lilien et al. |
| 2016/0178681 A1 | 6/2016 | Lilien et al. |
| 2017/0030943 A1 | 2/2017 | Nulty |

FOREIGN PATENT DOCUMENTS

| | | |
|---|---|---|
| WO | WO 2014/090416 A1 | 6/2014 |
| WO | WO 2016/102443 A1 | 6/2016 |

OTHER PUBLICATIONS

French Search Report dated Sep. 27, 2016, in French Application 1650466 filed Jan. 21, 2016.
Wang, W. et al., "Dynamic Line Rating Systems for Transmission Lines", U.S. Department of Energy, Electricity Delivery & Energy Reliability, American Recovery and Reinvestment Act of 2009, Topical Report, Apr. 2014, 131 pages.
Iglesias, J. et al., "Guide for Thermal Rating Calculations of Overhead Lines", vol. 601, Working Group B2.43, Dec. 2014, 95 pages.
Schell, P. et al., "Quantifying the limits of weather based dynamic line rating methods", Cigre Canada, Conference on Power Systems, Sep. 2011, 8 pages.
"IEEE Standard for Calculating the Current-Temperature of Bare Overhead Conductors", IEEE, IEEE Power Engineering Society, IEEE Std. 738, 2006, 69 pages.
Stephen, R. et al., "Thermal Behavior of Overhead Conductors", Working Group 22.12, Technical Brochure No. 207, Aug. 2002, 2 pages.

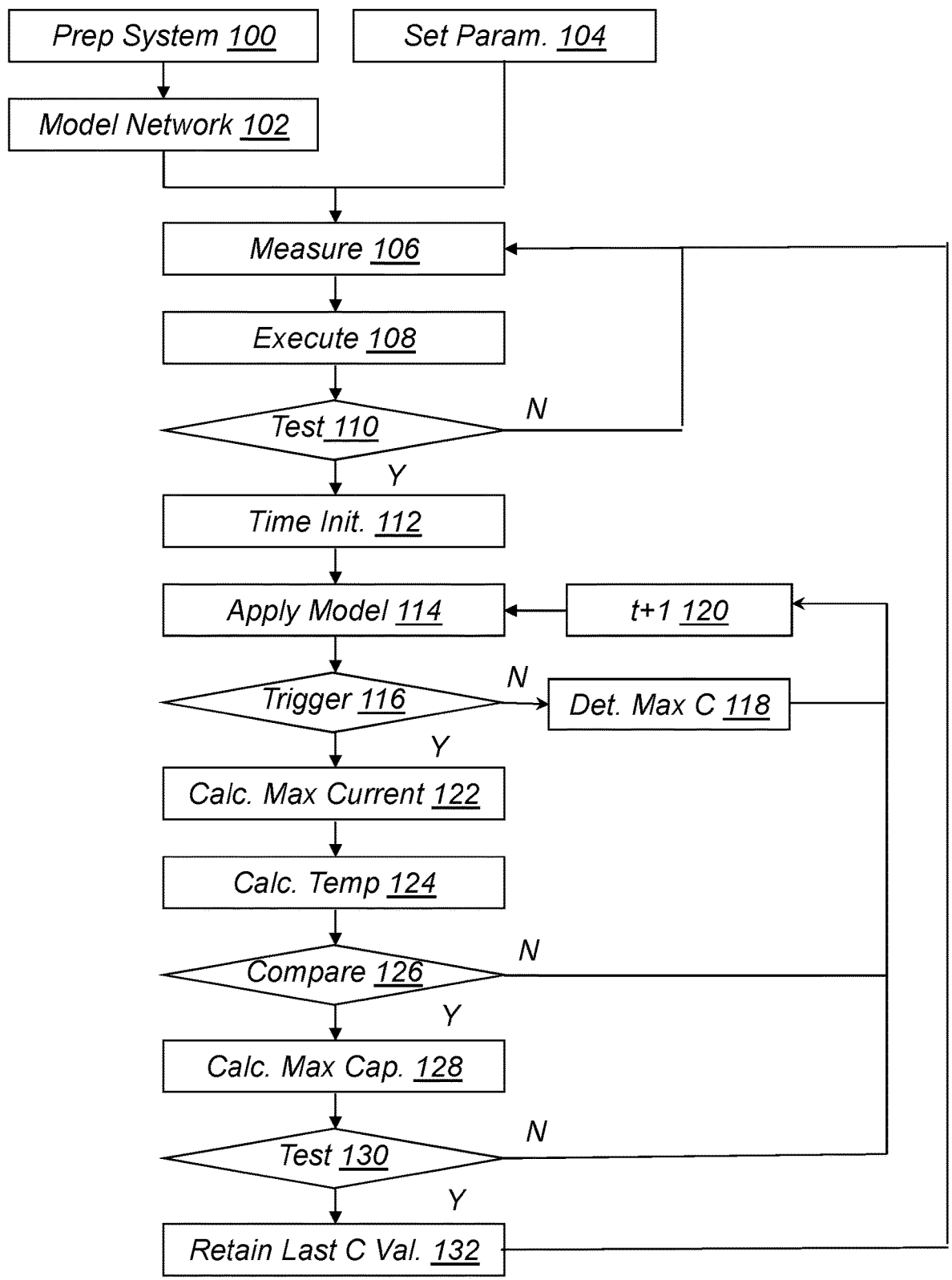

SYSTEM AND METHOD FOR DYNAMICALLY DETERMINING MAXIMUM ELECTRIC CURRENT CARRYING CAPACITIES

FIELD

This invention relates to a system for dynamically determining maximum electric current carrying capacities relative to a portion of a high-voltage electric current transmission network. It also relates to a corresponding method as well as to an electric transmission installation comprising such a system.

It relates more particularly to a system comprising:
  means for storing a model of the network portion, this model comprising singular points and at least one high-voltage electric current-carrying line between these singular points, a predetermined thermal equilibrium relationship, an operating limit temperature of each current-carrying line and conduction parameters of each current-carrying line,
  a computer, having access to the storing means, programmed to calculate at least one maximum capacity value at each singular point of the model of the network portion on the basis of the predetermined thermal equilibrium relationship, of each operating limit temperature, of each conduction parameter and of weather parameters.

BACKGROUND

The maximum electric current carrying capacity of a high voltage line, sometimes referred to as "ampacity", is the maximum permissible value of the intensity of the current carried by this line, expressed in amperes. It is generally posited as a postulate that this maximum capacity is a constant of which the value depends on the operating limit temperature, which itself is constant and calculated based on geometric parameters that are assumed to be constant of the high voltage line, and of weather parameters. The relationship between the maximum electric current carrying capacity and the operating limit temperature is then expressed according to a thermal equilibrium relationship supplying a value of intensity according to a temperature value of the conductor of the high voltage line, of weather parameters and of intrinsic data of the conductor. For a static calculation of this maximum capacity, the weather parameters are chosen a priori as the least favorable possible in the environment of the high voltage line in order to ensure that the result calculated in this way constitutes a limit value that is actually pertinent with respect to the risks of exceeding the operating limit temperature. Consequently, the maximum capacity calculated is generally largely suboptimal. Moreover, as the weather parameters are chosen a priori, the actual risks of exceeding the operating limit temperature, although limited, are generally not controlled.

It is increasingly frequent today to have recourse to dynamic determinations of maximum electric current carrying capacities of high voltage lines, consisting in replacing at least one portion of the unfavorable weather parameters with environmental data that is more realistic locally, originated from measurements. This is in particular the observation made by the document entitled "Dynamic line rating systems for transmission lines: topical report", published by the U.S. Department of Energy in April 2014.

A parameter that was detected as being particularly important, in particular in the document entitled "Guide for thermal rating calculations of overhead lines", published by the "B2-overhead lines" study committee of the Cigré organization, WG B2.43, in December 2014, is the speed of the wind, including its direction and its amplitude. Its impact is substantial on the cooling via convection of high voltage lines and therefore on the increase in their actual maximum capacities for carrying electricity. Unfortunately, this is a parameter that is generally considered to be difficult to measure locally and many solutions for dynamically determining maximum capacities of overhead lines attempt to circumvent it.

A first solution, called CAT-1 and marketed by the company "The Valley Group—a Nexans company" provides to deploy various sensors over a portion of a high-voltage electric current transmission network:
  mechanical tension sensors having the form of stress gauges, deployed on each high voltage line of the network portion considered in order to estimate the sag thereof, such as defined in U.S. Pat. No. 5,918,288, and
  net radiation sensors, deployed on the pylons of the network portion considered in order to measure the environmental data including the impact of the wind, such as defined in U.S. Pat. No. 5,559,430.

This first solution involves the installation of many sensors and singularly complicates the calculations of maximum capacities in the network portion considered.

A second solution, marketed by the company "Ampacimon" also provides to deploy sensors over a portion of a high-voltage electric current transmission network. More precisely, these sensors are deployed on each high voltage line of the network portion considered in order to measure the sag thereof by vibrational frequency analysis, as taught in patent application WO 2007/031435 A1. Wind sensors, as taught in patent application WO 2014/090416 A1, can also be arranged on high voltage lines.

This second solution also implies the installation of many sensors. Moreover, if it is desired to avoid the use of wind sensors, it complicates the calculations of maximum capacities in the network portion considered since they must then be carried out in two steps: using the predetermined thermal equilibrium relationship based on assumptions of sag measured, electric current measured and other known parameters in order to deduce therefrom an indirect estimation of the wind speed on each current-carrying line of the network portion; then again using the same predetermined thermal equilibrium relationship based on the wind speed estimated indirectly and on other known parameters in order to deduce therefrom the maximum capacity of each current-carrying line of the network portion. The article of Schell et al, entitled "Quantifying the limits of weather based dynamic line rating methods" and published on the occasion of Cigré Canada, Conference on Power Systems, Halifax, in September 2011, discloses the bases for this calculation in two steps which is complex.

SUMMARY

It can as such be desired to provide a system for dynamically determining maximum electric current carrying capacities that makes it possible to overcome at least one portion of the aforementioned problems and constraints.

A system for dynamically determining maximum electric current carrying capacities relative to a portion of a high-voltage electric current transmission network is therefore proposed, comprising:
  means for storing a model of the network portion, this model comprising singular points and at least one high-voltage electric current-carrying line between these singular points, a predetermined thermal equilibrium relationship, an operating limit temperature of each current-carrying line and conduction parameters of each current-carrying line, a computer, having access to the storing means, programmed to calculate at least one maximum capacity value at each singular point of the model of the network portion on the basis of the predetermined thermal equilibrium relationship, of each operating limit temperature, of each conduction parameter and of weather parameters, further comprising means for receiving, by the computer, wind speed values measured by a set of wind measurement stations deployed around the network portion, the computer then being programmed to:

select at least one wind measurement station in the set of wind measurement stations, apply a model of wind propagation from said at least one selected station towards the singular points of the model of the network portion, in order to estimate a wind speed value at each singular point on the basis of the wind speed values received, and calculate said at least one maximum capacity at each singular point taking into account said wind speed value estimated at each singular point in the predetermined thermal equilibrium relationship.

As such, thanks to such a system, a direct estimation of the speed of the wind at several sensitive points of the network portion considered is proposed by the clever application of a model of propagation that can be carried out on the basis of a limited number of wind measurement sensors. This estimation is then judiciously used in the predetermined thermal equilibrium relationship in order to optimize the calculation of the maximum capacities of the network portion. Many models of wind propagation are known to those skilled in the art and can be used. From the simplest to the most sophisticated according to the performance desired, they all have surprising results for calculating the maximum electric current carrying capacities in at least each singular point of a network portion considered. The latter can be estimated better, upwards, for a cost in sensors that can be limited.

Optionally, the computer is more precisely programmed to:

determine a main wind direction on the basis of the wind speed values received, and select the wind measurement station, referred to as the leeward station, located the furthest upstream in the main wind direction determined.

Also optionally:

the predetermined thermal equilibrium relationship is a mathematical equation that balances at least mathematical expressions of gains via the Joule effect and solar energy with mathematical expressions of losses via convection and electromagnetic radiation, and the computer is programmed to take account of said wind speed value estimated at each singular point in the mathematical expression of loss via convection.

Also optionally, the computer is further programmed to calculate a temperature value in at least one point of the model of the network portion for which a wind speed value has been estimated, on the basis of the predetermined thermal equilibrium relationship, a quantity of electric current carried by the current-carrying line comprising this point of the model of the network portion, the conduction parameters of this current-carrying line and weather parameters, taking into account said estimated wind speed value in the predetermined thermal equilibrium relationship.

Also optionally, the computer is programmed to trigger the calculation of said at least one maximum capacity at each singular point with the conditions that predetermined criteria of a minimum value for the wind speed and coherency, between them, of the wind speed values received are upheld.

Also optionally:

the predetermined criterion for the minimum value of the wind speed is defined in the following way: the wind speed value supplied by the leeward station must be greater in amplitude than a first threshold and each wind speed value supplied by a wind measurement station other than the leeward station must be greater in amplitude than a second threshold, with the second threshold being less than the first threshold, the predetermined criterion of coherency, between them, of the wind speed values received is defined in the following way: as the wind speed values received are vectorial, the angular difference between the various directions of these vector values must remain less than a third threshold and the difference in amplitude between the various norms of these vector values must remain less than a fourth threshold.

An electric transmission installation with dynamic determination of maximum electric current carrying capacities is also proposed, comprising:

a portion of a high-voltage electric current transmission network comprising local electrical substations and at least one high-voltage electric current distribution or transmission line carried by pylons between these local electrical substations, a set of wind measurement stations deployed around the network portion, and a system for dynamically determining maximum electric current carrying capacities according to the invention.

A method for dynamically determining maximum electric current carrying capacities relative to a portion of a high-voltage electric current transmission network is also proposed, comprising the following steps:

establishing a model of the network portion, this model comprising singular points and at least one high-voltage electric current-carrying line between these singular points, calculating at least one maximum capacity value at each singular point of the model of the network portion on the basis of a predetermined thermal equilibrium relationship, an operating limit temperature of each current-carrying line, conduction parameters of each current-carrying line and weather parameters, further comprising the following steps:

measuring wind speed values by a set of wind measurement stations deployed around the network portion, selecting at least one wind measurement station in the set of wind measurement stations, applying a model of wind propagation from said at least one selected station towards the singular points of the model of the network portion, in order to estimate a wind speed value at each singular point on the basis of the wind speed values received, and calculating said at least one maximum capacity at each singular point taking into account said wind speed value estimated at each singular point in the predetermined thermal equilibrium relationship.

Optionally:

each current-carrying line is subjected to an electric current carrying default capacity, the calculating of said at least one maximum capacity at each singular point is triggered with the condition that predetermined criteria of a minimum value for the wind speed and coherency, between them, of the wind speed values measured are upheld, and each default capacity is replaced with the smallest of the maximum capacities calculated at the singular points forming the ends of each respective current-carrying line, referred to as optimum capacity, if this optimum capacity is higher than the corresponding default capacity and if the predetermined criteria are upheld.

Also optionally:

the calculating of said at least one maximum capacity at each singular point is triggered at an instant T and established by time projection using the model of wind propagation for an instant T+H where H>0, between the instants T and T+H, the calculating of said at least one maximum capacity at each singular point is repeated and established by time projection for the instant T+H, and at the instant T+H, said at least one maximum capacity value retained at each singular point is the smallest of the corresponding maximum capacity values calculated between the instants T and T+H.

BRIEF DESCRIPTION OF THE DRAWINGS

The invention shall be better understood using the following description, provided solely by way of example and in reference to the accompanying drawings wherein:

FIG. 2 shows the successive steps of a method for dynamically determining maximum electric current carrying capacities implemented by the installation of FIG. 1.

DETAILED DESCRIPTION

Figure 1:
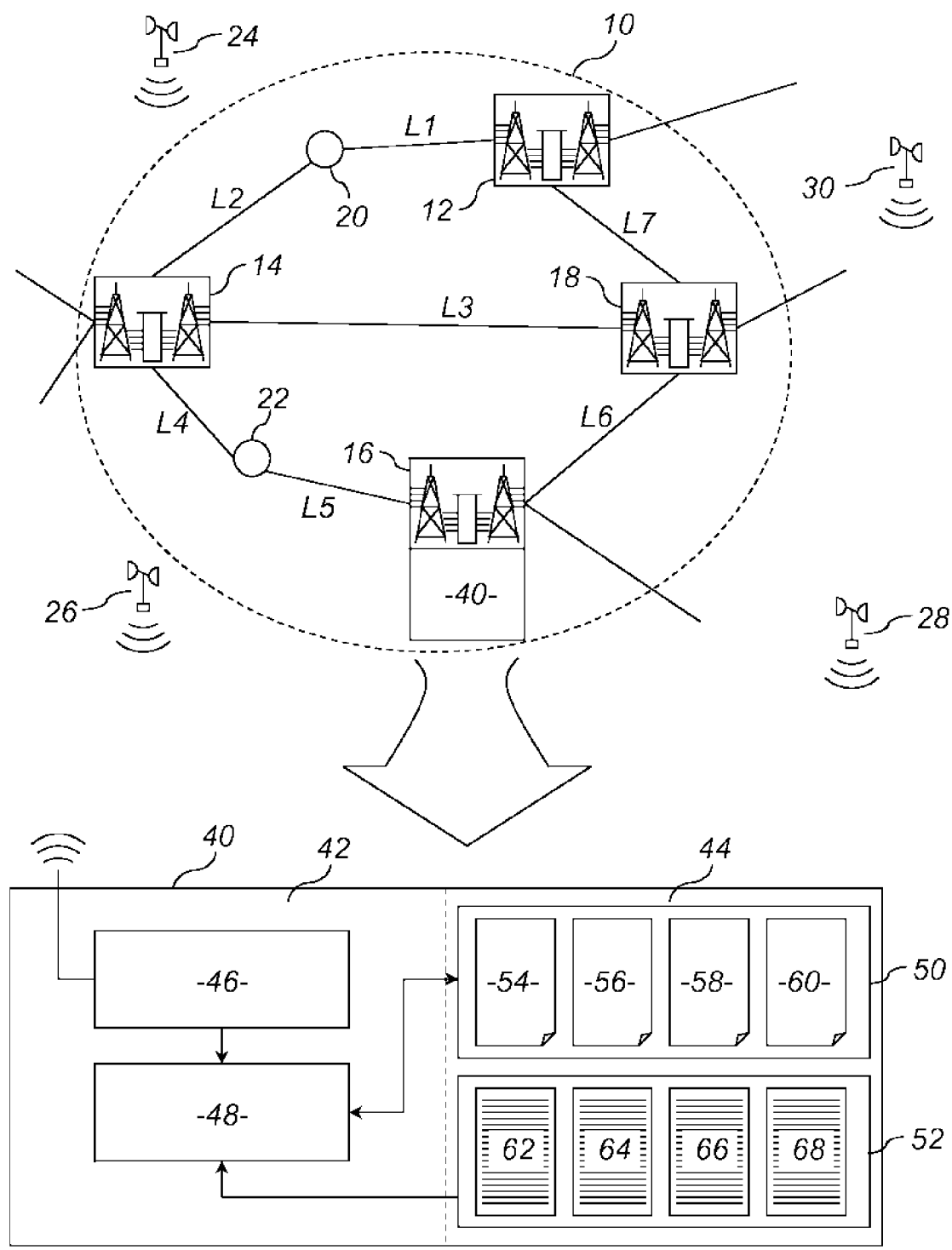
FIG. 1 diagrammatically shows the general structure of an electric transmission installation with dynamic determination of maximum electric current carrying capacities, according to an embodiment of the invention.

The electric transmission installation shown in FIG. 1 comprises a portion 10 of a high-voltage electric current transmission network that comprises local electrical substations, at least one high-voltage electric current distribution or transmission line between these substations and pylons in order to support each transmission or distribution line between two substations.

In this example, the network portion 10 comprises four local electrical substations 12, 14, 16 and 18, each one being defined, by the IEC (International Electrotechnical Commission), as a "portion of an electric network, located in the same place, mainly comprising the ends of the transport of distribution lines, the electrical equipment, buildings, and, possibly, transformers". A local electrical substation is therefore an element of the electric current transmission network that is used for both the transmission and the distribution of electricity. It makes it possible to raise the electric voltage for the transmission thereof at high voltage, and to lower it again for the purpose of the consumption thereof by users (private or industrial).

It is possible to establish a model of this network portion 10, comprised of singular points and of at least one high-voltage electric current-carrying line between these singular points. The local electrical substations 12, 14, 16 and 18 are located at the ends of the electric transmission or distribution lines, they form singular points of the network portion 10. Other singular points can furthermore be identified. For example, by imposing that each current-carrying line between two singular points of the model be homogeneous in terms of the operating limit temperature, cable section and/or rectilinear layout at +/−10°, some pylons of the network portion 10 can also form singular points. Two of these are for example shown in FIG. 1. A first pylon forming a singular point 20 is as such arranged on a transmission or distribution line between the local electrical substations 12 and 14 and a second pylon forming a singular point 22 is arranged on a transmission or distribution line between the local electrical substations 14 and 16.

In the particular non-limiting example of FIG. 1: the local electrical substation 12 is electrically connected to the local electrical substations 14 and 18 by transmission or distribution lines carried by pylons; the local electrical substation 14 is electrically connected to the local electrical substations 12, 16 and 18 by transmission or distribution lines carried by pylons; and the local electrical substation 16 is electrically connected to the local electrical substations 14 and 18 by transmission or distribution lines carried by pylons.

The model of the network portion 10 shown in FIG. 1 as such comprises six singular points 12, 14, 16, 18, 20, 22 connected together by seven homogeneous current-conducting lines L1 (between the singular points 12 and 20), L2 (between the singular points 20 and 14), L3 (between the singular points 14 and 18), L4 (between the singular points 14 and 22), L5 (between the singular points 22 and 16), L6 (between the singular points 16 and 18) and L7 (between the singular points 18 and 12). Other outgoing current-carrying lines of the network portion 10 moreover each have an end connected to one of the four local electrical substations 12, 14, 16 and 18. This is of course only a simple and non-limiting example provided for a good illustration of the invention.

The electric transmission installation shown in FIG. 1 further comprises a set of wind measurement stations 24, 26, 28, 30 deployed around the network portion 10 in order to measure wind speed values. Each wind speed value measured by any of the wind measurement stations 24, 26, 28, 30 comprises a direction of the wind and an amplitude of the wind expressed for example in m/s. This is therefore a vector value. These stations can be arranged independently of the various singular points 12, 14, 16, 18, 20 and 22. They have means for emitting, for example via radio waves, the values that they measure.

Finally, the electric transmission installation shown in FIG. 1 comprises a system 40 for dynamically determining maximum electric current carrying capacities relative to the network portion 10. This is the maximum capacities of each one of the current-carrying lines that apply in particular at their ends, i.e. at each singular point, and for each current-carrying line connected to each singular point, of the model of the network portion 10. This system 40, such as shown diagrammatically in FIG. 1, is for example installed in one of the local electrical substations, here the substation 16. It could also be installed entirely independent of the network portion 10. It is implemented in a computing device such as a conventional computer and comprises a processing unit 42 conventionally associated with a memory 44 (for example a RAM memory) for the storage of data files and computer programs.

The processing unit 42 comprises a receiver 46 of the values measured emitted by the wind measurement stations 24, 26, 28, 30 and a computer 48, for example a microprocessor, able to process the values provided by the receiver 46.

The memory 44 is partitioned into a first zone 50 for storing processing data and a second zone 52 for storing computer programs. This partition is purely functional, chosen for a clear presentation of the system 40, but does not necessarily reflect the actual organization of the memory 44.

The first storage zone 50 first of all comprises data 54 relative to the model, detailed hereinabove, of the network portion 10. This data includes parameters for identifying and characterizing singular points 12, 14, 16, 18, 20, 22 and homogeneous current-conducting lines L1, L2, L3, L4, L5, L6, L7, including, in addition to the topological or geographical considerations, an operating limit temperature and conduction parameters for each current-carrying line.

The first storage zone 50 further comprises data 56 relative to a predetermined thermal equilibrium relationship. This relationship is for example a mathematical equation that balances at least mathematical expressions of gains via the Joule effect and solar energy with mathematical expressions of losses via convection and electromagnetic radiation. This can in particular be a relationship originating from the IEEE equation in permanent regime, define in the document entitled "IEEE standard for calculating the current-temperature relationship of bare overhead conductors", published by IEEE Power Engineering Society under the reference IEEE Std 738™-2006, in January 2007. It can also be a relationship originating from the Cigré equation in permanent regime, defined in the document entitled "Thermal behavior of overhead conductors", published by the "B2-overhead lines" study committee of the Cigré organization, WG 22.12, in August 2002, or specified in the document "Guide for thermal rating calculations of overhead lines" mentioned hereinabove. It has for example the general form:

$$P_J + P_S = P_C + P_R,$$

where $P_J$ is the thermal gain by the Joule effect, $P_S$ the thermal gain via solar energy, $P_C$ the thermal loss through convection and $P_R$ the thermal loss through electromagnetic radiation. Refer to the documents mentioned hereinabove for examples of detailed expressions of each one of these gains or losses.

The first storage zone 50 further comprises data 58 relative to general weather parameters concerning the geographical zone wherein the network portion 10 is located. These parameters can be chosen a priori as the most unfavorable possible in the environment of the network portion 10. They can concern zonings, statistical calculations, regular measurements, etc. They comprise for example values for the ambient temperature and sunshine which are according to the location and the season. Note that some of the data 58 can alternatively be replaced or updated dynamically by the values supplied to the computer 48 via the receiver 46. In particular, values for the outside temperatures at different points of the network portion 10 can be supplied dynamically to the computer 48 for a better processing carried out by the latter through the taking account thereof in the predetermined thermal equilibrium relationship 56.

The first storage zone 50 finally comprises data 60 relative to a model for wind propagation. Many propagation models that are more or less sophisticated are known. This can for example be a proportional linear projection model according to which the propagation speed is taken as arbitrarily equal to the amplitude of the speed of the wind, while the direction of the propagation, considered to be flat, is that of the wind. Such a model, particularly simple, is far from being perfect, but it is already able to provide good results for a dynamic estimation of the maximum capacities mentioned hereinabove. It makes it possible to construct a history of the wind speed values for each point of the model 54 of the network portion 10, and in particular for each singular point. Such a history grows progressively as the measurements are taken by the wind measurement stations 24, 26, 28, 30.

The second storage zone 52 such as shown in FIG. 1 functionally comprises four computer programs or four functions of the same computer program 62, 64, 66, 68. Note indeed that the computer programs 62, 64, 66, 68 are presented as being separate, but this distinction is purely functional. They can also be grouped together according to all possible combinations into one or several softwares. Their functions could also be at least partially micro programmed or micro wired in dedicated integrated circuits. As such, alternatively, the computer device that implements the processing unit 42 and its memory 44 could be replaced with an electronic device comprised solely of digital circuits (without a computer program) in order to perform the same actions.

The first computer program 62 comprises instructions lines for the execution of a selection of a wind measurement station, referred to as the leeward station, from the stations 24, 26, 28, 30 available, on the basis of wind speed values measured and transmitted to the microprocessor 48 by the intermediary of the receiver 46. A non-limiting operating example of this first program will be detailed in reference to FIG. 2. Alternatively and according to the complexity of the model 60 of wind propagation retained, such a program could select several wind measurement stations from those that are available.

The second computer program 64 comprises instructions lines for the application of the model 60 of wind propagation from the leeward station to the singular points 12, 14, 16, 18, 20, 22 of the model 54 of the network portion 10, for the estimation of successive wind speed values at each singular point on the basis of successive wind speed values measured by the leeward station. A non-limiting operating example of this second program will be detailed in reference to FIG. 2.

The third computer program 66 comprises instruction lines for the execution of the calculating of at least one maximum electric current carrying capacity value at each singular point 12, 14, 16, 18, 20 and 22 of the model 54 of the network portion 10 on the basis of:
  the predetermined thermal equilibrium relationship 56,
  each operating limit temperature and each network conduction parameter recorded with the data of the model 54 of the network portion 10,
  general weather parameters 58, and
  any weather parameters dynamically supplied to the computer 48, such as outside temperatures measured,
taking account, in the predetermined thermal equilibrium relationship 56, the wind speed values estimated at all of the singular points 12, 14, 16, 18, 20, 22 by execution of the second program 64.

More precisely and in accordance with the teaching of the document "Guide for thermal rating calculations of overhead lines" mentioned hereinabove, the wind speed values can be taken into account in the mathematical expression of loss via convection $P_C$ of the expression $P_J + P_S = P_C + P_R$.

In the example of FIG. 1, there are two maximum capacity values that can be calculated at the singular point 12, one for the current-carrying line L1, the other for the current-carrying line L7. Three maximum capacity values can be calculated at the singular point 14, one for the current-carrying line L2, another for the current-carrying line L3, the last for the current-carrying line L4. Two maximum capacity values can be calculated at the singular point 16, one for the current-carrying line L5, the other for the current-carrying line L6. Three maximum capacity values can be calculated at the singular point 18, one for the current-carrying line L6, another for the current-carrying line L3, the last for the current-carrying line L7. Two maximum capacity values can be calculated at the singular point 20, one for the current-carrying line L1, the other for the current-carrying line L2. Two maximum capacity values can be calculated at the singular point 22, one for the current-carrying line L4, the other for the current-carrying line L5.

The fourth computer program 68 comprises instruction lines for the optional execution of the calculation of an actual temperature value at each singular point 12, 14, 16, 18, 20 and 22 of the model 54 of the network portion 10 on the basis of:

the same predetermined thermal equilibrium relationship 56,
a quantity of electric current actually carried by each current-carrying line and each network conduction parameter recorded with the data of the model 54 of the network portion 10,
general weather parameters 58, and
any weather parameters dynamically supplied to the computer 48, such as outside temperatures measured, by taking account, in the predetermined thermal equilibrium relationship 56, the wind speed values estimated at all of the singular points 12, 14, 16, 18, 20, 22 by execution of the second program 64.

Details on a method for dynamically determining maximum electric current carrying capacities in the network portion 10, implemented by execution of computer programs 62, 64, 66, 68 using the microprocessor 48, shall now be provided in reference to FIG. 2.

During a prior step 100 of preparing the system 40, the network portion 10 in which this dynamic determination of the maximum capacities is intended to be applied is defined by its perimeter, the local electrical substations that it contains and the transmission or distribution lines between these substations. The set of wind measurement stations deployed around the network portion 10 defined is moreover selected.

Advantageously, but without constraint or obligation, such a network portion 10 has one or several of the following characteristics:

its geographical perimeter is not excessively extended, in such a way that it has homogeneous geographical characteristics in terms of relief (it must remain relatively flat) and obstacles (they must also be as few in number as possible),
it constitutes an "electric pocket": this means that it comprises an autonomous zone that satisfies homogeneous local electrotechnical rules in terms of power, transport and supply of electricity,
it is supplied by a significant wind turbine farm that generates demands for carrying capacities that increase with the force of the wind: this is then all the interest of the invention to be able to dynamically estimate upwards the maximum carrying capacities of the network portion 10 according to the speed of the wind.

During a following step 102 of modeling the network portion 10 defined hereinabove, the model 54 of this network portion 10 is established and recorded in the memory 44 on the basis of a map of the local electrical substations and of the transmission or distribution lines that it contains. This step 102 can be executed automatically using a computer program (not shown) that is specifically implemented in the system 40. This primarily entails determining the singular points of the model 54: the latter include all of the local electrical substations as well as certain pylons located at the ends of homogeneous segments of high voltage lines in terms of a rectilinear layout (an angular deviation at +/−10% able for example to be allowed), of cable sections and of operating limit temperatures. For example the model 54 is as such obtained shown in FIG. 1 by the singular points 12, 14, 16, 18, 20, 22 and the homogeneous current-conducting lines L1, L2, L3, L4, L5, L6, L7.

During a step of parameter setting 104, which can take place before, during or after the steps 100 and 102, at least one value $V_{min}$ of the minimum wind speed, a value $\Delta V_{max}$ of the maximum variation of wind speeds between wind measurement stations and a value $\Delta \theta_{max}$ of the maximum angular variation of wind directions between wind measurement stations are predetermined. The value $V_{min}$ makes it possible to define a minimum wind speed value beyond which it is not deemed useful to execute the computer programs 66 and 68, even the computer program 64, as such imposing a first predetermined criterion that conditions the triggering of the calculation of the maximum electric current carrying capacities at each singular point. The values $\Delta V_{max}$ and $\Delta \theta_{max}$ make it possible to define maximum values for the variations in the measurements between wind measurement stations beyond which it is not deemed useful to execute the computer programs 66 and 68, even the computer program 64, as such imposing a second predetermined criterion of coherency of these measurements between them that conditions the triggering of the calculation of the maximum electric current carrying capacities at each singular point. These criteria make it possible to take the most advantage from the method of FIG. 2 knowing that it provides effective results when the wind speed measurements supplied by the various wind measurement stations are coherent between them and when the wind measured exceeds a certain value to be determined specifically as a function of each context in which the invention is implemented.

Then, during a step of measurement 106, each wind measurement station 24, 26, 28, 30 locally measures a succession of wind speed values. Each value measured is vectorial and transmitted to the receiver 46 of the system 40.

During a step 108, the microprocessor 48 of the system 40 triggers the execution of the first computer program 62. During this step, it determines a main wind direction on the basis of the latest wind speed values received. This can be done in a manner known per se via a calculation of the angular average of the wind directions measured by the various wind measurement stations 24, 26, 28, 30. On the basis of this value of the main direction of the wind, the microprocessor 48 determines the leeward wind measurement station, i.e. the one, from the stations 24, 26, 28, 30, which is located the furthest upstream in the main wind direction determined.

The step 108 is followed by a test 110 during which the criteria for triggering the calculation of the maximum electric current carrying capacities at each singular point of the network portion 10 are upheld. The first criterion, relative to the value $V_{min}$, is broken down into two criteria concerning thresholds $V_{min}[1]$ and $V_{min}[2]$ according to which the wind speed value supplied by the leeward station must be greater in amplitude than $V_{min}[1]$ and each wind speed value supplied by a wind measurement station other than the leeward station must be greater in amplitude than $V_{min}[2]$, with $V_{min}[2]<V_{min}[1]$. It is for example possible to choose $V_{min}[1]=5$ m/s and $V_{min}[2]=2$ m/s. The second criterion, of coherency, imposes that the angular difference between the different directions of the vector values measured remains less than $\Delta\theta_{max}$ and the difference in amplitude between the various norms of the vector values measured remains less than $\Delta V_{max}$. A difference of 10% around the average values can for example be tolerated.

When these criteria are upheld, the method passes to a following step 112. Otherwise, it returns to the step 106 for another series of measurements.

During the step 112, a time initialization is triggered by the microprocessor 48. A first instant T is established starting from which it is decided to begin the dynamic calculation of the maximum capacities via time projection using the model 60 of wind propagation for a second instant T+H, where H>0, starting from which these maximum capacities calculated can, where applicable, be applied to the network portion 10. By considering Dmax as the maximum distance between the leeward station and the singular point that is the farthest in the network portion 10, and in light of $V_{min}[1]$ which is the minimum speed measured at the output of the step 110, so that it is certain to be able to estimate the speed of the wind at each singular point of the network portion 10 via time projection at the instant T+H, it is preferable to ensure that H≥Dmax/$V_{min}[1]$. As such, H=90 mn is sufficient for a maximum distance of 27 km.

Furthermore, during this same step 112, a time index t that can be incremented in steps of $\Delta t$ between T and T+H is initialized at t=T. For H=90 mn, it is possible for example to choose $\Delta t$=6 mn.

Furthermore, as each current-carrying line is subjected to a default electric current carrying capacity for example determined according to the techniques known in prior art, it is possible to associate an operational capacity by default to each one of the singular points of the network portion 10 for each one of the current-carrying lines to which it is connected.

Finally, for each singular point and each current-carrying line to which it is connected, a value C of the maximum capacity is initialized at infinity (+∞).

The step 112 is followed by a loop of steps 114, 116, 118, 120, 122, 124, 126, 128, 130 which is executed for at least each one of the singular points of the model 54 of the network portion 10 and for each one of the current-carrying lines to which it is connected.

As such, for a singular point considered and for a current-carrying line considered to which it is connected, during the step 114, carried out by execution of the second computer program 64, the model of wind propagation is applied to at least one wind speed value measured by the leeward wind measurement station over a period that ends at the instant t in order to determine by time projection, if this is possible in light of the speeds measured and of the distance between the leeward station and the singular point considered, a wind speed value at the singular point considered at the instant T+H.

Then, during a test step 116, the first criterion for triggering the calculation of the maximum electric current carrying capacity at the singular point considered and for the current-carrying line considered can again be checked on the basis of the wind speed value determined in the step 114. For example, it must be greater in amplitude than $V_{min}[1]$.

If this is not the case, the method passes to a following step 118 during which the maximum capacity at the singular point considered at the instant t is set to its default operating value. Then it passes to a step 120 of incrementing t to t+$\Delta t$ before returning to the step 114.

If the wind speed value determined in the step 114 upholds the criterion of the step 116, the method passes to a step 122 of dynamically calculating the maximum electric current carrying capacity at the singular point considered for the current-carrying line considered by execution of the third computer program 66 by taking account of the wind speed value determined in the step 114 in the predetermined thermal equilibrium relationship 56 and by also taking account of the properties of the current-carrying line considered. It is then possible to deduce from this a maximum capacity value calculated at the instant t for the instant T+H.

Then the method may pass to an optional step 124 of dynamically calculating an actual temperature value at the singular point considered for the current-carrying line considered by execution of the fourth computer program 68 by taking account of the same parameters as in the preceding step and of the quantity of electric current actually carried. This optional step can for example be used to validate the pertinence of the dynamic calculation of the maximum capacities by comparing the values of actual temperatures estimated with actual temperature measurements taken by sensors. More generally, this step of calculating can be carried out at any point of the network portion 10 provided with a temperature sensor or with any other means of evaluating the cable temperature (directly or indirectly by measuring the sag, the mechanical tension or the vibrational frequency of the cable for example).

During a following test step 126, the maximum capacity calculated dynamically in the step 122 is compared to the default operating capacity of the singular point considered for the current-carrying line considered. If the dynamically calculated value is less than or equal to the default operating capacity, it is the latter that is retained as the value calculated in the step 122, then the method returns to the step 120 as long as the time index t is less than T+H.

If the value calculated dynamically is greater than the default operating capacity or if the instant T+H was reached in the step 126, the method passes to a following step 128. During this step 128, the maximum capacity calculated dynamically in the step 122 is compared to the value C. If it is higher, C remains unchanged, otherwise C is replaced with this maximum capacity calculated at the instant t for the instant T+H during the step 122.

Then, a test step 130 is carried out on the time index t. If the latter is less than T+H, the method returns to the step 120.

Otherwise, it passes to a final step 132 during which the last value of C is retained as the maximum electric carrying capacity at the instant T+H at the singular point considered for the current-carrying line considered. This is, in light of the step 128, the smallest of the maximum capacity values dynamically calculated that passed the test of the step 126. Moreover, once the loop of steps 114 to 130 executed for at least each one of the singular points of the model 54 of the network portion 10, the maximum capacities calculated may be reviewed downwards in the following way: for each current-carrying line, the maximum capacities dynamically calculated for the instant T+H at its two ends are compared and it is the diminishing value which is finally retained at the two singular points concerned for the current-carrying line considered. As such, each default capacity is replaced with the smallest of the maximum capacities calculated at the singular points forming the ends of each respective current-carrying line, referred to as optimum capacity, if this optimum capacity is higher than the corresponding default capacity and if the predetermined criteria indicated hereinabove are upheld.

It is then up to the operator of the network portion 10 to apply all or a portion of the values of the optimum capacities starting from the instant t+H in such a way as to respond to the demands of supplier or consumers of electricity.

Following the step 132, the method returns to the step 106 for another series of measurements.

It appears clearly that a system for dynamically determining maximum electric current carrying capacities such as the one described hereinabove makes it possible to simply and cleverly take account of wind speed measurements in order to obtain a more favorable estimation of these maximum capacities. Given that the cooling effect of the wind is accompanied by an increasing electricity production capacity when the network portion concerned is connected to a wind turbine farm, it is in particular in this context that the invention has its best results.

Note moreover that the invention is not limited to the embodiment described hereinabove.

In particular, the topology of the network portion considered can be of any topology whatsoever, with that of FIG. 1 being chosen for the purposes of illustration solely for its simplicity.

Moreover, the wind measurement stations 24, 26, 28, 30 were shown as being arranged independently of the network portion 10, but they could also be installed in at least one portion of the local electrical substations, in particular those located at the periphery of the network portion (which is the case of the four substations shown in FIG. 1).

Moreover also, the model 60 of wind propagation by linear projection taken as an advantageous example could be replaced with any other known model, with the adaptation of the invention to a known model of propagation other than the one shown hereinabove being within the scope of those skilled in the art.

Moreover also, the detailed method in reference to FIG. 2 can be broken down according to a large number of alternatives that it is impossible to list in a complete manner, wherein only the following general steps must necessarily be implemented:

establishing a model of the network portion, this model being comprised of singular points and of at least one high-voltage electric current-carrying line between these singular points, measuring wind speed values by a set of wind measurement stations deployed around the network portion, selecting at least one wind measurement station in the set of wind measurement stations, applying a model of wind propagation from said at least one selected station towards the singular points of the model of the network portion, in order to estimate a wind speed value at each singular point on the basis of the wind speed values received, and calculating at least one maximum capacity value at each singular point of the model of the network portion on the basis of a predetermined thermal equilibrium relationship, an operating limit temperature of each current-carrying line, conduction parameters of each current-carrying line and weather parameters, taking into account said wind speed value estimated at each singular point in the predetermined thermal equilibrium relationship.

Note in particular that the calculations of the maximum capacities can be executed for points of the model of the network portion other than the singular points, in particular all along at least one portion of the current-carrying lines.

It will appear more generally to those skilled in the art that various modifications can be made to the embodiment described hereinabove, in light of the teaching that has just been disclosed of it. In the following claims, the terms used must not be interpreted as limiting the claims to the embodiment disclosed in this description, but must be interpreted as including therein all of the equivalents that the claims aim to cover due to the formulation thereof and of which the prevision is within the scope of those skilled in the art by applying their general knowledge to the implementation of the teaching that has just been disclosed.

The invention claimed is:

1. A system for dynamically determining maximum electric current carrying capacities relative to a portion of a high-voltage electric current transmission network, comprising:

means for storing a model of the network portion, this model comprising singular points and at least one high-voltage electric current-carrying line between these singular points, a predetermined thermal equilibrium relationship, an operating limit temperature of each current-carrying line and conduction parameters of each current-carrying line, a computer, having access to the storing means, programmed to calculate at least one maximum capacity value at each singular point of the model of the network portion on the basis of the predetermined thermal equilibrium relationship, of each operating limit temperature, of each conduction parameter and of weather parameters, characterized in that it further comprises means for receiving, by the computer, wind speed values measured by a set of wind measurement stations deployed around the network portion, and in that the computer is programmed to:

select at least one wind measurement station in the set of wind measurement stations, apply a model of wind propagation from said at least one selected station towards the singular points of the model of the network portion, in order to estimate a wind speed value at each singular point on the basis of the wind speed values received, and calculate said at least one maximum capacity at each singular point taking into account said wind speed value estimated at each singular point in the predetermined thermal equilibrium relationship.

2. The system for dynamically determining maximum electric current carrying capacities as claimed in claim 1, wherein the computer is more precisely programmed to:

determine a main wind direction on the basis of the wind speed values received, and select the wind measurement station, referred to as the leeward station, located the furthest upstream in the main wind direction determined.

3. The system for dynamically determining maximum electric current carrying capacities as claimed in claim 1, wherein:

the predetermined thermal equilibrium relationship is a mathematical equation that balances at least mathematical expressions of gains via the Joule effect and solar energy with mathematical expressions of losses via convection and electromagnetic radiation, and the computer is programmed to take into account said wind speed value estimated at each singular point in the mathematical expression of loss via convection.

4. The system for dynamically determining maximum electric current carrying capacities as claimed in claim 1, wherein the computer is further programmed to calculate a temperature value in at least one point of the model of the network portion for which a wind speed value has been estimated, on the basis of the predetermined thermal equilibrium relationship, a quantity of electric current carried by the current-carrying line comprising this point of the model of the network portion, the conduction parameters of this current-carrying line and weather parameters, taking into account said estimated wind speed value in the predetermined thermal equilibrium relationship.

5. The system for dynamically determining maximum electric current carrying capacities as claimed in claim 1, wherein the computer is programmed to trigger the calculation of said at least one maximum capacity at each singular point with the conditions that predetermined criteria of a minimum value for the wind speed and coherency, between them, of the wind speed values received are upheld.

6. The system for dynamically determining maximum electric current carrying capacities as claimed in claim 5, wherein:
the predetermined criterion for the minimum value of the wind speed is defined in the following way: the wind speed value supplied by the leeward station must be greater in amplitude than a first threshold and each wind speed value supplied by a wind measurement station other than the leeward station must be greater in amplitude than a second threshold, with the second threshold being less than the first threshold,
the predetermined criterion of coherency, between them, of the wind speed values received is defined in the following way: as the wind speed values received are vectorial, the angular difference between the various directions of these vector values must remain less than a third threshold and the difference in amplitude between the various norms of these vector values must remain less than a fourth threshold.

7. An electric transmission installation with dynamic determination of maximum electric current carrying capacities, comprising:
a portion of a high-voltage electric current transmission network comprising local electrical substations and at least one high-voltage electric current distribution or transmission line carried by pylons between these local electrical substations,
a set of wind measurement stations deployed around the network portion, and
a system for dynamically determining maximum electric current carrying capacities as claimed claim 1.

8. A method for dynamically determining maximum electric current carrying capacities relative to a portion of a high-voltage electric current transmission network, comprising the following steps:
establishing a model of the network portion, this model comprising singular points and at least one high-voltage electric current-carrying line between these singular points,
calculating at least one maximum capacity value at each singular point of the model of the network portion on the basis of a predetermined thermal equilibrium relationship, an operating limit temperature of each current-carrying line, conduction parameters of each current-carrying line and weather parameters,
characterized in that it further comprises the following steps:
measuring wind speed values by a set of wind measurement stations deployed around the network portion,
selecting at least one wind measurement station in the set of wind measurement stations,
applying a model of wind propagation from said at least one selected station towards the singular points of the model of the network portion, in order to estimate a wind speed value at each singular point on the basis of the wind speed values received, and
calculating said at least one maximum capacity at each singular point taking into account said wind speed value estimated at each singular point in the predetermined thermal equilibrium relationship.

9. The method for dynamically determining maximum electric current carrying capacities as claimed in claim 8, wherein:
each current-carrying line is subjected to an electric current carrying default capacity,
the calculating of said at least one maximum capacity at each singular point is triggered with the condition that predetermined criteria of a minimum value for the wind speed and coherency, between them, of the wind speed values measured are upheld, and
each default capacity is replaced with the smallest of the maximum capacities calculated at the singular points forming the ends of each respective current-carrying line, referred to as optimum capacity, if this optimum capacity is higher than the corresponding default capacity and if the predetermined criteria are upheld.

10. The method for dynamically determining maximum electric current carrying capacities as claimed in claim 9, wherein:
the calculating of said at least one maximum capacity at each singular point is triggered at an instant T and established by time projection using the model of wind propagation for an instant T+H where H>0,
between the instants T and T+H, the calculating of said at least one maximum capacity at each singular point is repeated and established by time projection for the instant T+H, and
at the instant T+H, said at least one maximum capacity value retained at each singular point is the smallest of the corresponding maximum capacity values calculated between the instants T and T+H.

* * * * *